(12) United States Patent
Bergenek et al.

(10) Patent No.: US 10,697,592 B2
(45) Date of Patent: Jun. 30, 2020

(54) LIGHTING MEANS COMPRISING LEDS

(71) Applicant: LEDVANCE GmbH, Garching (DE)

(72) Inventors: Krister Bergenek, Regensburg (DE); Florian Bosl, Regensburg (DE); Andreas Dobner, Wenzenbach (DE); Tobias Schmidt, Garching bei Munchen (DE)

(73) Assignee: LEDVANCE GMBH, Garching bei München (DE)

( * ) Notice: Subject to any disclaimer, the term of this patent is extended or adjusted under 35 U.S.C. 154(b) by 81 days.

(21) Appl. No.: 15/566,556

(22) PCT Filed: Feb. 17, 2016

(86) PCT No.: PCT/EP2016/053321
§ 371 (c)(1),
(2) Date: Oct. 13, 2017

(87) PCT Pub. No.: WO2016/165855
PCT Pub. Date: Oct. 20, 2016

(65) Prior Publication Data
US 2018/0080613 A1    Mar. 22, 2018

(30) Foreign Application Priority Data
Apr. 15, 2015   (DE) .................. 10 2015 206 802

(51) Int. Cl.
| | |
|---|---|
| *F21V 7/05* | (2006.01) |
| *F21V 17/00* | (2006.01) |
| *F21K 9/237* | (2016.01) |
| *F21V 17/06* | (2006.01) |
| *F21K 9/232* | (2016.01) |

(Continued)

(52) U.S. Cl.
CPC .............. *F21K 9/237* (2016.08); *F21K 9/232* (2016.08); *F21K 9/60* (2016.08); *F21K 9/66* (2016.08); *F21K 9/68* (2016.08); *F21V 7/05* (2013.01); *F21V 17/06* (2013.01); *F21V 19/0015* (2013.01); *F21V 29/508* (2015.01); *F21V 29/70* (2015.01); *F21V 19/001* (2013.01); *F21Y 2107/90* (2016.08); *F21Y 2115/10* (2016.08);
(Continued)

(58) Field of Classification Search
CPC ............. F21K 9/237; F21K 9/232; F21V 7/05
See application file for complete search history.

(56) References Cited

U.S. PATENT DOCUMENTS

| | | | |
|---|---|---|---|
| 8,858,027 B2 | 10/2014 | Takeuchi et al. | |
| 9,117,991 B1 | 8/2015 | Olson et al. | |

(Continued)

FOREIGN PATENT DOCUMENTS

| | | |
|---|---|---|
| WO | 2014087357 A1 | 6/2014 |
| WO | 2014167480 A1 | 10/2014 |
| WO | 2016165854 A1 | 10/2016 |

*Primary Examiner* — Karabi Guharay
(74) *Attorney, Agent, or Firm* — Hayes Soloway PC

(57) ABSTRACT

The present invention relates to a lighting means comprising at least two LEDs, mounted on opposite sides of a flat printed circuit board, said printed circuit board being combined with a reflector which is free of LEDs, a part of the light emitted by each LED being reflected by the reflector to homogenize the light distribution generated by the lighting means, and specifically in each case with a directional component parallel to a surface direction of the flat printed circuit board.

24 Claims, 8 Drawing Sheets

(51) Int. Cl.
  *F21K 9/60*   (2016.01)
  *F21V 29/508*  (2015.01)
  *F21V 29/70*  (2015.01)
  *F21K 9/66*   (2016.01)
  *F21K 9/68*   (2016.01)
  *F21V 19/00*  (2006.01)
  *F21Y 115/10*  (2016.01)
  *F21Y 107/90*  (2016.01)
  *H05K 1/02*   (2006.01)

(52) U.S. Cl.
  CPC . *H05K 1/0209* (2013.01); *H05K 2201/10106* (2013.01)

(56) References Cited

U.S. PATENT DOCUMENTS

| | | |
|---|---|---|
| 10,006,608 B2 | 6/2018 | Bukkems et al. |
| 10,129,960 B2 | 11/2018 | Earl et al. |
| 2007/0002572 A1* | 1/2007 | Ewig ............... B64D 47/06 362/470 |
| 2012/0032577 A1 | 2/2012 | Huang |
| 2012/0134133 A1* | 5/2012 | Kang ............... F21V 3/00 362/84 |
| 2013/0294092 A1 | 11/2013 | Hussell et al. |
| 2014/0375202 A1 | 12/2014 | Yang et al. |
| 2015/0252991 A1* | 9/2015 | Li ............... F21V 23/004 362/646 |
| 2015/0292686 A1 | 10/2015 | Negley et al. |
| 2018/0106432 A1 | 4/2018 | Bergenek et al. |

* cited by examiner

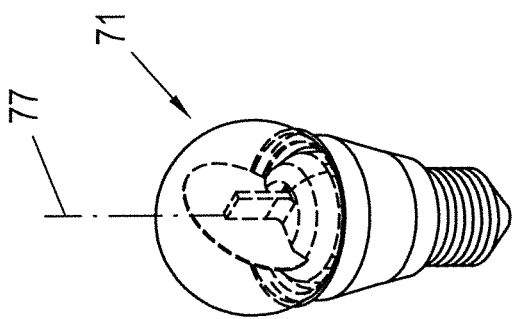
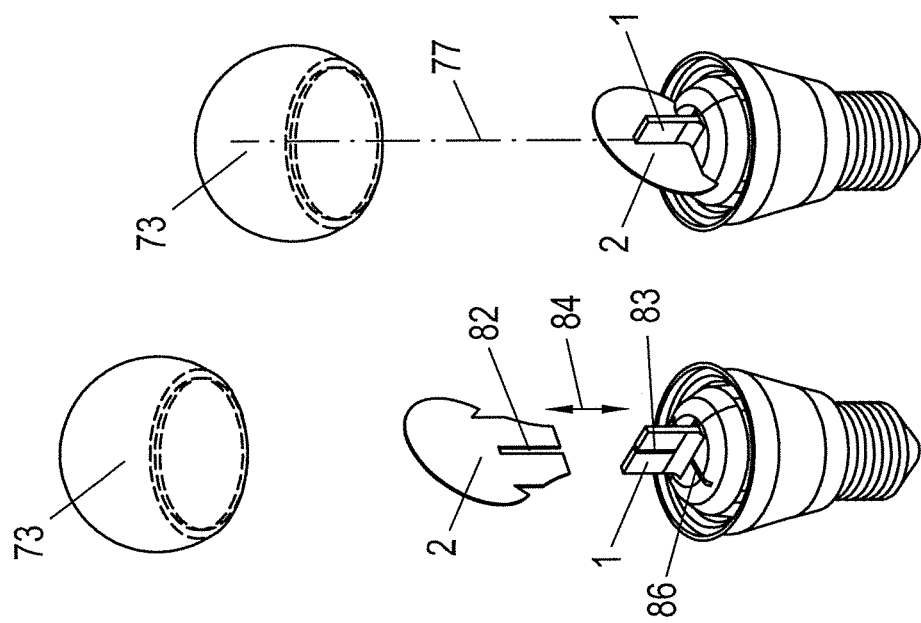
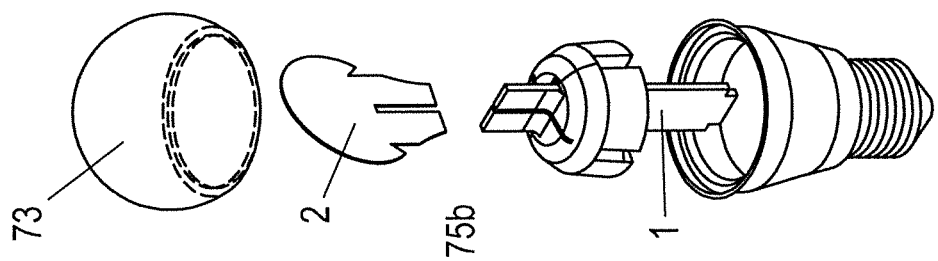
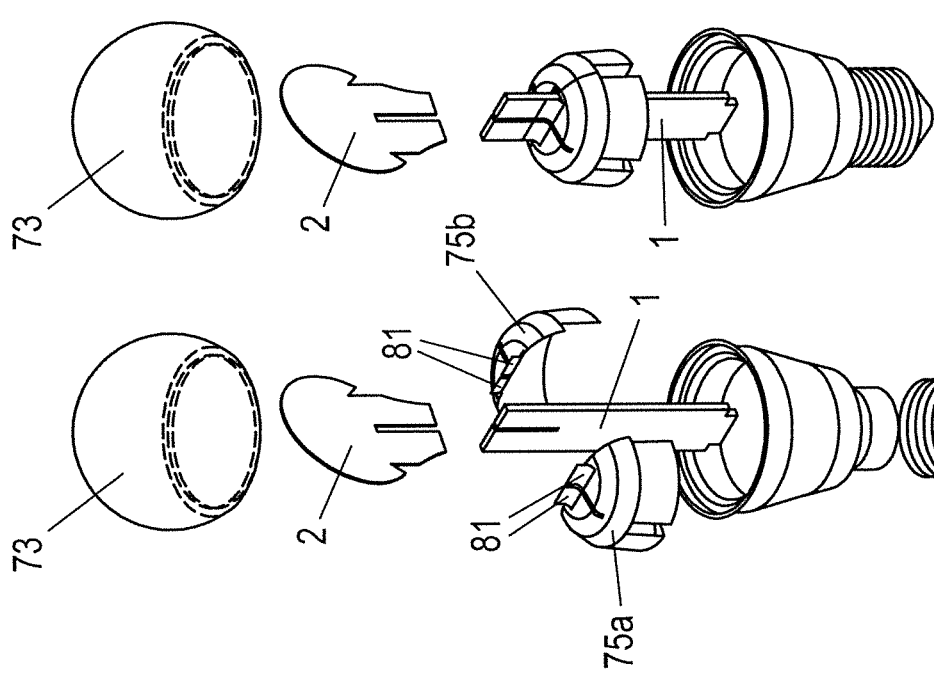

LIGHTING MEANS COMPRISING LEDS

CROSS-REFERENCE TO RELATED APPLICATION AND PRIORITY

This patent application is a U.S. National Stage of International Patent Application No. PCT/EP2016/053321 filed on Feb. 17, 2016, which claims priority from German Patent Application No. 102015206802.1 filed on Apr. 15, 2015. Each of these patent applications is herein incorporated by reference in its entirety.

TECHNICAL FIELD

The present invention relates to a lighting means having LEDs arranged on a circuit board, wherein the circuit board having the LEDs is arranged in an outer bulb.

BACKGROUND OF THE INVENTION

A conventional lighting means such as, for example, a filament bulb emits light with approximately omnidirectional light distribution, thus, in simple terms, the same amount of light is emitted in all directions (except for shading by the base of the filament bulb, for example). An LED, on the other hand, emits light directionally, namely generally with Lambertian light distribution. The light intensity, or radiant intensity, is thus maximum, for example, along a surface normal to a radiating surface of the LED and decreases as the angle relative to the surface normal increases.

In order to generate homogeneous light distribution despite this directional light emission for each LED, there are known from the prior art, for example, lighting means in which a plurality of LEDs are mounted on a three-dimensional carrier, for example on five side surfaces of a cuboid. The side surfaces, and thus the main beam directions of each of the LEDs arranged thereon, point in different directions, so that approximately omnidirectional light distribution can be generated overall. However, the mere production, let alone the three-dimensional equipping, of such a three-dimensional carrier can be complex and thus cost-intensive.

SUMMARY OF THE INVENTION

The technical problem underlying the present invention is to provide a lighting means that is advantageous over the prior art.

This object is achieved according to the invention with a lighting means having a first and a second LED for emitting light, a flat circuit board with a conductive track structure, on which circuit board the LEDs are mounted and thereby electrically conductively connected to the conductive track structure, a reflector assembled with the circuit board, said reflector being itself free of LEDs, an outer bulb which is transmissive for the light emitted by the LEDs and in which the circuit board with the LEDs and the reflector are arranged, and a base with which the LEDs are electrically operably connected via the conductive track structure, wherein the first and the second LED are mounted on mutually opposite sides of the circuit board and, for each LED, at least 20% of the emitted light is incident on the reflector and is reflected thereby in order to homogenize the light distribution generated by the lighting means, for which purpose the particular reflected light has a main propagation direction with a directional component parallel to a surface direction of the flat circuit board.

Preferred embodiments will be found in the dependent claims and in the disclosure as a whole, a specific distinction not always being made in the presentation between device aspects and method or use aspects; in any case, the disclosure is implicitly to be read in respect of all claim categories.

In simple terms, a basic idea of the invention is to provide the LED light to two mutually opposite main directions directly by means of the circuit board equipped with LEDs on both sides, and to provide the LED light to directions that primarily are scarcely provided or are not provided at all, which are parallel to the surface directions of the circuit board, indirectly via the reflector. Accordingly, not every main direction that is required in respect of approximate omnidirectionality has its own associated LED, but the light emitted by the LEDs is partially redistributed by the reflector. For example, in comparison with the cuboid mentioned at the beginning, it is thus not necessary to equip five side surfaces with LEDs but only two, namely the mutually opposite side surfaces of the flat circuit board. This in itself is already a simpler component, and in addition it can also be simpler, for example, to equip two sides with LEDs than to equip a three-dimensional carrier.

The "flat" circuit board has a smaller extent (thickness) in a thickness direction than in the surface directions perpendicular thereto. In each of the surface directions, which also include the length and width of the circuit board (see below), the extent of the circuit board should be, for example, at least 5, 10, 15, or 20 times the thickness, a thickness averaged over the circuit board being considered. The "mutually opposite sides" of the circuit board are mutually opposite in relation to the thickness direction and are also referred to as "side surfaces" of the circuit board (which are connected together via one or more edge surfaces of the circuit board extending in the thickness direction). The LEDs are mounted on the side surfaces extending in the surface directions (no LEDs are provided on the edge surfaces, thus they are free of LEDs).

Although the LEDs could also be mounted on the circuit board with their respective LED main propagation direction generally tilted slightly relative to the thickness direction, preference is given to LED main propagation directions parallel to the thickness direction, which are thus then mutually opposite for the first and the second LED. The "LED main propagation direction" for each LED is considered to be the direction that is obtained as the average of all the direction vectors along which the LED emits light, each direction vector being weighted in this averaging with the light intensity associated therewith (each direction in which a light source radiates can be described as a vector, with which a light intensity can be associated).

With the circuit board alone, directions around the thickness direction would be well provided with light, but the surface directions would be underprovided or not provided at all. Therefore, for each LED, at least 20%, with increasing preference in this order at least 25%, 30%, 35%, or 40%, of the total light emitted by the particular LED should be incident on the reflector and be reflected thereby with a directional component parallel to a surface direction. The "main propagation direction" of the reflected light, which has (not necessarily only) a directional component parallel to a surface direction, is formed as an average in the manner described above for the LED main propagation direction (there being used as the basis all the directions in which the light coming from a respective LED is reflected). By means of the reflector, light is provided to directions which originally were underprovided, thus the light distribution generated by the lighting means is homogenized.

The reflector for its part is free of LEDs, thus is itself not equipped with LEDs. In this respect, the reflector is a "passive" component. By providing the reflector and the circuit board as components which are originally separate and are then assembled in the lighting means, each component can advantageously be optimized. Thus, the circuit board, for example, has the conductive track structure for wiring the LEDs, while the reflector will preferably be free of such a structure. The reflector can be produced overall from a simpler material, or material composite, compared to the circuit board, which can help to optimize costs. The circuit board is preferably the only component of the lighting means that is equipped with LEDs, which makes the lighting means comparatively simple overall.

On the other hand, the reflector (because of reduced costs per unit area of the material) can then be designed or formed, for example, with a larger surface area compared to the circuit board, in particular compared to the portion of the circuit board arranged inside the outer bulb. The reflector can be optimized in respect of the optical properties (reflectance/surface area) and the circuit board can be optimized, for example, in respect of thermal requirements (heat dissipation from the LEDs). The circuit board and the reflector are "assembled", that is to say connected together, for example, at most by a friction-based, interlocking and/or material-based connection, preferably the two components are slotted and fitted into one another in the slot direction (see below).

The LEDs "mounted" on the circuit board are preferably soldered, at least some of the soldered connections at the same time establishing the electrical contact between the conductive track structure and the LED and serving to mechanically fix the LED (however, soldered connections that serve only for mechanical fixing/thermal connection can additionally be provided). Preferred LEDs are so-called SMD (surface mounted device) components, which are soldered in a reflow process. The lighting means can be electrically connected (from outside in use) via the base.

The LEDs are "electrically operably" connected to the base, that is to say to the connecting points thereof that serve for contacting from outside, preferably with the interposition of a driver electronics (between the connecting points of the base and the LEDs). The lighting means is preferably configured for operation at mains voltage (at least 100 volts), thus mains voltage can be applied to the base connecting points and is preferably adapted for operation of the LEDs by means of a driver electronics of the lighting means.

The lighting means is preferably designed as a filament bulb replacement; the base is preferably an Edison base, particularly preferably with the thread identifier E27. The "transmissive" outer bulb can be translucent and/or transparent. In general, the outer bulb can thus be clear/transparent, but it is preferably frosted, thus, for example (when the lighting means is not emitting light), the circuit board is visible through the outer bulb from outside at most as an outline, preferably not at all. The frosting can be achieved, for example, by scattering centers, in particular scattering particles, embedded in the material of the outer bulb, and/or by scattering centers arranged on the surface of the outer bulb, for example a surface roughening and/or surface coating. Preference is given to a coating on the inside, that is to say a coating on the inner wall surface facing the LEDs, which can provide protection against scratches, for example, in use.

The circuit board having the LEDs is so arranged in the outer bulb that the majority of the light emitted by the LEDs passes through the outer bulb, that is to say passes from inside to outside and is usable in an application. "Majority" in this respect can mean, for example, at least 70%, preferably at least 80%, further preferably at least 90%; a possible upper limit may be, for example, not more than 99.9%. The light emitted by the LEDs can be incident on the inner wall of the outer bulb and pass through it to the outside partly directly and partly after prior reflection.

In a preferred embodiment, the reflector is a one-piece component which thus cannot be dismantled into individual parts without being damaged (without damaging part of the component). In other words, the different reflector regions at which the light of the various LEDs is reflected are joined together via the reflector itself. Thus, although the reflector could generally also be composed, for example, of a plurality of individual components which are seated on the circuit board separately, it is preferably a cohesive component which is assembled as a whole with the circuit board. This can help to simplify, or reduce, for example, the necessary working steps in mass production.

In general, the reflector is preferably a component which is substantially planar, for example to the extent of at least 50%, 60%, 70%, 80%, or 90% of its surface area (with increasing preference in the order given), a corresponding percentage of the mutually opposite side surfaces of which thus each lie in a plane, which planes are parallel to one another (within the scope of conventional manufacturing variations and on the relevant dimensional scales in the present case). Part regions of the reflector may be folded out of the planes in order to optimize the light distribution (see below in detail). The reflector, like the circuit board, is "flat" (larger extent in the surface directions than in the thickness direction), and the definitions mentioned above for the circuit board are also to be disclosed for the reflector; likewise analogously to the circuit board, "side surfaces" refers to the surfaces of the reflector that are opposite one another in relation to the thickness direction.

The reflector can be composed, for example, of a core which is likewise flat in the above-mentioned sense and which is coated, preferably on both sides (on the two mutually opposite side surfaces in relation to the thickness direction), with a reflective layer, which then forms the reflecting surface. The reflective layer is preferably produced from a plastics material with reflective particles, for example white pigments, embedded therein. The core is preferably a metal core, which can have advantages from the thermal point of view.

In other preferred embodiments, the reflector is a monolithic part which, apart from, for example, particles or inclusions randomly distributed therein, is thus free in its interior of material boundaries between different materials or materials of different manufacturing origins. Thus, the reflector is then not a multilayer system as described above, but is a single-layer system, the mutually opposite (in relation to the thickness direction) side surfaces of this layer forming the reflective surfaces. This single-layer reflector can be provided, for example, in the form of a metal plate, for example with polished side surfaces. However, a single-layer reflector of a plastics material, in which, for example, reflective particles and/or gas bubbles are embedded (arranged therein in a randomly distributed manner) is also possible.

In general, the reflector, that is to say at least the side surfaces thereof on which the light of the LEDs is incident, should have a reflectivity, averaged over the visible spectral range (380 nm to 780 nm), for example, of at least, with increasing preference in this order, 80%, 85%, 90%, or 95%; a possible upper limit may be, for example, 99.9%. Where reference is made to the "at least 20% of the light for each LED" that is incident on the reflector and is reflected thereby, in each case slightly more light may thus be incident thereon, of which a smaller portion is not reflected. Diffuse reflection is generally preferred, the reflective surface of the reflector is preferably white. The circuit board, apart from the regions equipped with LEDs, can, for example, also preferably be provided with a reflective surface, for example with a coating mentioned above in the context of the reflector having a core, which coating is preferably diffusely reflective.

In a preferred embodiment, the reflector and the circuit board, each as one-piece parts, are fitted into one another at a right angle to one another. For that purpose, both in the circuit board and in the reflector, a substantially straight slot which passes through the circuit board/reflector completely in the thickness direction preferably extends from one edge surface of the circuit board/reflector to a point on the circuit board/reflector. The slots each have a straight extent (in the slot direction, perpendicular to the respective thickness direction) at least insofar as the reflector in an end position then extends in the slot in the circuit board, and vice versa; preferably, the slot in the reflector is also straight overall, thus the flanks delimiting it are parallel to one another.

The circuit board and the reflector are then fitted into one another in the slot direction. The circuit board is then arranged in the slot in the reflector, and vice versa. Preference is given to an arrangement such that the slot direction in each case extends parallel to an outer bulb longitudinal axis referred to below, the slots particularly preferably coincide therewith.

In a preferred embodiment, one of the flanks which delimits the slot in the circuit board in respect of the surface directions thereof forms a projection. When the reflector is fully inserted, this projection engages into a hole in the reflector and thus prevents it from slipping out. The slot in the circuit board preferably widens towards an outer edge of the circuit board, which facilitates insertion of the reflector. In the end position, there are then preferably three contact regions between the inserted reflector and the slot flanks. One of the contact regions is arranged on one of the two slot flanks; the two other contact regions are located on the opposite slot flank, namely on either side of the first-mentioned contact region, in relation to the longitudinal extent of the slot. The contact regions stabilize the reflector in its straight extent.

With regard to the preferably planar form of the reflector, reference is made to the above disclosure. The circuit board is also preferably planar, at least apart from an applied layer system, such as, for example, the conductive track structure, that is to say a local topography; for example, at least a substrate (see below in detail) of the circuit board should be planar, the circuit board then being referred to as planar.

In a preferred embodiment, in the case of the particular reflected light the directional component that increases the light distribution in the surface direction (the main propagation direction of the reflected light) should be dominant; the directional component perpendicular thereto should account for, for example, not more than 50%, 25%, or 15% of the directional component parallel to the surface direction. At least in an idealized view, the directional component perpendicular to the surface direction can also be equal to zero, namely in the case of perfectly diffuse reflection.

In a preferred embodiment, the "particular" light is reflected diffusely by the reflector, namely perfectly diffusely within the scope of what is technically possible. Ideally, the reflection produces a kind of virtual light source which emits substantially at a right angle to the LED emitting the reflected light and thus provides light to the surface directions. The "particular" reflected light comes in each case from precisely one of the LEDs.

The main propagation direction of the particular reflected light is tilted relative to the particular LED main propagation direction preferably by at least 20°, at least 30°, 40°, 50°, 60°, 70°, or 80° being further lower limits with increasing preference in the order given (this preferably also applies to a third and fourth LED, see below). Independently thereof, possible upper limits may be, for example, not more than 140°, 120° or 100° (with increasing preference in the order given).

In a preferred embodiment, the LEDs are each spaced apart from an edge, at which the side surface of the circuit board having the particular LED and the side surface of the reflector on which the light emitted by the particular LED is incident, adjoin one another, by not more than 8 mm, with increasing preference in this order by not more than 7 mm, 6 mm, 5 mm, 4 mm, or 3 mm. The distance is taken along a surface direction of the circuit board; the smallest distance is considered, that is to say, for example, the distance between a side wall of the LED facing the edge and parallel to the edge and the edge, or the distance between a corner of the LED facing the edge and the edge.

The inventors have found that, by correspondingly placing the LEDs as close as possible to the reflector, good distribution of the light in the surface directions can be achieved. A lower limit for the distance may also be, for example, 0.5 mm or 1 mm, due to the installation. The distances disclosed above and below for the first and second LED are also preferred for a third and fourth LED (see below).

In a preferred embodiment, which likewise relates to the distance of the particular LED from the particular edge, the smallest distance between the LED and the edge should correspond to not more than 0.3 times an average extent d of a side surface of the reflector, with not more than 0.2 times being further preferred and not more than 0.1 times being particularly preferred. The average extent d is formed as the average of the extents taken in each case perpendicularly away from the edge to a margin of the side face, that is to say averaged over the extents taken along the edge.

In a preferred embodiment, the circuit board having the LEDs is so arranged in the outer bulb that the LED main propagation directions enclose an angle of at least 80°, preferably at least 85°, and not more than 100°, preferably not more than 95°, with a longitudinal direction parallel to the outer bulb longitudinal axis and facing away from the base towards the outer bulb; particularly preferably, the LED main propagation directions are in each case perpendicular to the outer bulb longitudinal direction. The outer bulb longitudinal axis passes through the base; preferably, the outer bulb is radially symmetrical, particularly preferably rotationally symmetrical, about the longitudinal axis.

Preferably, therefore, the particular LED main propagation directions and further preferably also the particular main propagation directions of the particular reflected light are within the above-mentioned limits, that is to say substantially perpendicular to the outer bulb longitudinal axis. The redistribution by reflection thus takes place in respect of a circular path about the outer bulb longitudinal axis. Preferably, the circuit board and the reflector intersect, and a corresponding region of intersection, which can be regarded approximately as a line of intersection, contains the outer bulb longitudinal axis over its length, thus in particular the corresponding slot or slots (see above) contain the outer bulb longitudinal axis in each case over their length.

In a preferred embodiment, a third and a fourth LED are additionally provided, wherein the first and the third LED are arranged together on the same side of the circuit board and also the second and the fourth LED are arranged together on the same side of the circuit board (opposite the first and third LED). The reflector then extends between the LEDs in such a manner that the light from the LEDs arranged on the same side of the circuit board is in each case incident on mutually opposite sides of the reflector. The light from the first LED is incident on one side surface of the reflector, and the light from the third LED is incident on the opposite side surface; likewise, the light from the second LED is incident one side surface of the reflector and the light from the fourth LED is incident on the opposite side surface (the light from the first and second LED is incident on the same side surface of the reflector, and the light from the third and fourth LED is incident on the same side surface, opposite the above-mentioned side surface). Further preferably, the first and the fourth LED and the second and the third LED are arranged radially symmetrically to one another with respect to the outer bulb longitudinal axis, in each case by 180°.

Preferably, the cross-wise arrangement of the circuit board and the reflector thus results in four quadrants which follow one another in the circular path direction (based on a circular path around the outer bulb longitudinal axis), and there is associated with each quadrant at least one LED, some of the light of which is redistributed by the reflector (the light distribution is homogenized with respect to the circular path direction). Where reference is made to a first and second or third and fourth LED, this generally specifies in each case a minimum number of LEDs, which should be arranged accordingly. It is thus also possible, for example, for a plurality of LEDs, for example at least 2, 3, 4, or 5 LEDs, per quadrant to be associated with the reflector; possible upper limits may be, for example, in each case not more than 15 or 10. In general, further LEDs that are not associated with the reflector in the corresponding manner can also be provided, but in each case preferably at least 20% of the light from all the LEDs of the lighting means is incident on the reflector and is reflected at the reflector in a manner described herein.

In a preferred embodiment, a part region of the reflector is partially separated from the remainder of the reflector, that is to say by means of an open (unclosed) parting line, and is folded out relative to the remainder of the reflector in such a manner that light reflected at the reflector part region has a main propagation direction with a dominant directional component parallel to the outer bulb longitudinal axis. A fold line, about which the part region is folded out, extends, for example, from one end point to the other end point of the unclosed parting line. The parting line can be stamped, for example.

The folded-out part region should be small in relation to the remainder of the reflector, that is to say have a surface area of the reflector as a whole of not more than 30%, with increasing preference in this order not more than 25%, 20%, 15%, 10%, or 5%. A plurality of part regions may also be folded out, but preferably not more than two. If a plurality of part regions are folded out, the total surface area thereof in the reflector as a whole is preferably not more than 30%, whereby the upper limits mentioned above are also preferred and are to be disclosed in this case too.

By means of the folded-out part region(s), directions around the outer bulb longitudinal axis can thus advantageously be provided with light, that is to say homogenization by reflection can thus be achieved not only in respect of the circular path direction. Apart from the folded-out part region (s), the remainder of the reflector is preferably planar.

In a preferred embodiment there is provided an additional transverse reflector which, as a previously separate part, is assembled with the circuit board and the reflector; in this respect, reference is made to the above disclosure relating to the "assembly" of the circuit board and the reflector, which is also to be disclosed in relation to the transverse reflector. The transverse reflector extends transversely to the outer bulb longitudinal axis, preferably with a surface area of, with increasing preference in this order, at least 30%, 50%, 70%, or 90% perpendicular thereto; particularly preferably it fully extends perpendicularly to the outer bulb longitudinal axis.

The transverse reflector is preferably produced from the same material or material composite as the reflector, and reference is made generally to the above disclosure relating to the reflector, for example with regard to a preferred flat and planar form of the transverse reflector.

The transverse reflector can have, for example, a surface area, taken in its surface directions, of at least 1 cm$^2$, 3 cm$^2$, or 5 cm$^2$, possible upper limits (independently of the lower limits) are, for example, not more than 20 cm$^2$, 15 cm$^2$, or 10 cm$^2$. In general, that is to say also independently of the presence of a transverse reflector, the surface area of the reflector, taken in the surface directions thereof, can be, for example, at least 4 cm$^2$, 6 cm$^2$, 8 cm$^2$, 10 cm$^2$, 12 cm$^2$, 14 cm$^2$, or 16 cm$^2$, possible upper limits (independently of the lower limits) are, for example, not more than 30 cm$^2$, 25 cm$^2$, or 20 cm$^2$. The surface area of a planar reflector can, for example, also be determined at a perpendicular projection of the particular reflector (reflector or transverse reflector) in question into a plane perpendicular to its thickness direction, namely as the total surface area enclosed by the outer edge of this projection.

In a preferred embodiment, the LEDs each emit light with a light distribution whose full width at half maximum is greater than 120°, preferred lower limits, with increasing preference in this order, being at least 130°, 140°, or 145°. LEDs with Lambertian light distribution (full width at half maximum of 120°) are thus not used; instead, there are used, for example, LEDs whose light in each case already originally fills a solid angle which is greater than a half space. Possible upper limits of the full width at half maximum of the light distribution of the particular LED light may be, for example, not more than 180°, 170°, or 160°.

In general within the scope of this disclosure, but in particular in this context, "LED" preferably means a housed LED chip, which is thus, for example, partially encapsulated in potting material. Light emission beyond the half-space in which the LED main propagation direction points can be achieved, for example, by a housing having side wall surfaces which are transmissive for the LED light. Regardless of the specific implementation, the inventors have observed a particularly pronounced homogenization in respect of the circular path direction for LEDs with a correspondingly wide light distribution; the directions around the outer bulb longitudinal axis can thus optionally also be better provided.

In a preferred embodiment, the light distribution of the lighting means is so homogenized that the light intensity measured on a circular path around the outer bulb longitudinal axis (at an elevation angle of 90°, that is to say perpendicular to the longitudinal direction of the outer bulb) exhibits at most a slight variation. Any light intensity value taken on this circular path should thus represent at least 30%, preferably at least 25%, of a maximum value of the light intensity taken on the circular path. Preferably, the light intensity also exhibits a correspondingly small variation at other (but always constant, for each circular path) elevation angles.

Preferably, in all directions which enclose an angle of between 0° and a critical angle with the longitudinal direction of the outer bulb (see above), a light intensity other than zero is still measured, which preferably represents at least 10%, further preferably at least 20% or 30% of a maximum light intensity. The critical angle is, with increasing preference, greater than 90°, 100°, 110°, 120°, 130°, 140°, 150°, or 160°; at angles greater than 170°, the light intensity can be zero.

In a preferred embodiment, the circuit board is composed of a substrate, for example FR4, the mutually opposite sides of which are provided with structured conductive track material, preferably copper, which forms the conductive track structure. The substrate is flat and preferably planar, thus the mutually opposite side surfaces of the substrate each lie in a plane, which planes are parallel to one another (and spaced apart from one another by the substrate thickness). Preference is given to a non-electrically conductive substrate, to which the conductive tracks are further preferably applied directly.

Further preferably, the conductive tracks, which are particularly preferably produced from copper, have a thickness, taken perpendicularly to the surface directions of the circuit board, of at least 35 µm, with increasing preference in this order at least 50 µm, 75 µm, 100 µm, 125 µm, 150 µm, 175 µm, 200 µm, 225 µm, or 250 µm. Possible upper limits may be, for example, not more than 750 µm, 500 µm, 400 µm, or 300 µm. With conductive tracks that are correspondingly as thick as possible, good heat dissipation from the LEDs can be achieved, for example. On the other hand, the present concept, that is to say the provision of a circuit board equipped with LEDs on both sides in combination with a reflector, also actually permits the use of correspondingly thick conductive tracks, because the system as a whole is nevertheless still optimized in terms of cost. Correspondingly thick conductive tracks can also be technically problematic in the prior art mentioned at the beginning with the three-dimensional carrier. In general, it is preferred that the circuit board having the LEDs is the only circuit board of the lighting means that is equipped with LEDs.

Independently of the thickness or configuration specifically, the conductive tracks of the circuit board can preferably be covered at least in part with a reflective layer (with regard to the preferred material properties and reflection properties thereof, reference is made to the above disclosure relating to the reflector having a core). The reflective layer preferably then covers the circuit board completely on both sides, apart from windows for each of the LEDs. Such a window should, for example, be not more than 10% or 50% larger than the base area of the LED arranged therein.

The circuit board can also be composed of a plurality of substrate layers, that is to say at least two and preferably not more than four or three, particularly preferably exactly two substrate layers. The preferably two substrate layers are preferably each provided on one side with conductive tracks, thus one side surface of each substrate layer is free of conductive tracks; the substrate layers are then further preferably assembled with their LED-free side surfaces facing one another, so that the outer side surfaces of the resulting multilayer substrate are then provided with conductive tracks. The substrate layers are integral with one another so that they cannot be separated from one another without damaging one of them or a part connecting them, in particular a connecting layer. In general, they can also simply be in contact with one another, they are preferably connected together by a material-based joint connecting layer, particularly preferably an adhesive layer.

The substrate layers can be produced, for example, from the above-mentioned FR4, thus the circuit board can be assembled, for example, from two circuit board parts each provided on one side with conductive tracks. The conductive tracks of the two circuit board parts can then be electrically conductively connected to one another, for example, by means of a clamp as connector. The substrate layers are preferably produced from a polyester material, polyethylene terephthalate (PET) is particularly preferred. The substrate layers can, for example, each have a thickness of at least 150 µm, 200 µm or 250 µm and (independently thereof) of, for example, not more than 500 µm, 450 µm, 400 µm, or 350 µm, in each case with increasing preference in the order given (the thickness is generally considered to be an average, it is preferably constant).

It can be preferred that the substrate layers are/have been formed from a substrate sheet which is/has been laid back on itself; the substrate sheet is preferably folded back on itself about a fold line. The substrate sheet is preferably laid or folded back with the LEDs already mounted thereon, which allows one-sided equipping (of the substrate sheet) while nevertheless resulting in a multi-layer substrate equipped on both sides. Such an advantage can moreover also arise if, as described above, two circuit board parts each provided with conductive tracks on one side are assembled and are already each equipped with LEDs when assembled.

It is also possible that an LED is arranged on a surface part of the circuit board which is tilted relative to the remainder of the circuit board such that the LED main propagation direction of the LED arranged thereon has a dominant directional component along the outer bulb longitudinal axis, thus an angle range about the outer bulb longitudinal axis is already originally provided with light by this LED. Such a surface part can be, for example, a part region of an above-mentioned substrate layer which is folded out by a bridge region relative to the remainder of the substrate layer.

The surface part/part region can be folded out relative to the remainder of the circuit board, for example, by an angle of at least 80° and preferably not more than 100°, particularly preferably exactly 90°. Although this is a possibility for providing the directions around the outer bulb longitudinal direction, preferably all the LED main propagation directions of all the LEDs mounted on the circuit board, preferably of all the LEDs of the lighting means as a whole, point in one of two exactly mutually opposite directions (which are perpendicular to the circuit board).

In general, the circuit board preferably has a width, taken in one of the surface directions, of not more than 30 mm, with not more than 25 mm being further preferred and not more than 20 mm being particularly preferred. Possible lower limits can be, for example, at least 15 mm or 18 mm. In a surface direction perpendicular to the above-mentioned surface direction, the circuit board preferably has a length of not more than 60 mm, with not more than 55 mm being further preferred and not more than 50 mm being particularly preferred. The mentioned upper limits are to be understood as meaning that the circuit board, in the case of the width, has a width over its entire length that is smaller than/equal to the upper limit, and in the case of the length has a corresponding length over the entire width.

In a preferred embodiment, a heat sink is provided in direct thermal contact with the circuit board, wherein said heat sink either forms an outer surface of the lighting means itself or is provided in direct thermal contact with part of the lighting means, preferably a housing part (see below) separate from the base, which forms an outer surface of the lighting means. The thermal resistance Rth of the heat sink is dependent, for example, on the thermal conductivity of the heat sink material and on the connection thereof, but should be not more than 25 K/W, whereby not more than 20 K/W, 15 K/W, 10 K/W, or 5 K/W are further upper limits of increasing preference in the order given. A thermal contact resistance between the circuit board and the heat sink should preferably be small, that is to say, for example, should represent not more than 50%, 40%, 30%, 20%, or 10% of the thermal resistance Rth of the heat sink; the same is true for any thermal contact resistance to the part forming the outer surface of the lighting element (provided this does not itself form the outer surface).

The material of the heat sink is preferably a metal, for example aluminum, but it is also possible to provide, for example, a thermally conductive plastics material, that is to say, for example, a plastics material with particles embedded therein to increase the thermal conductivity. In general, the heat sink, for example, could also serve as the above-mentioned transverse reflector, wherein the surface of the heat sink may, e.g., be coated for that purpose (see the above disclosure relating to the reflector having a core).

"In direct thermal contact" means with at most a material-based connecting layer therebetween, for example a solder layer, preferably directly in contact with one another. Preferably, the heat sink is in contact (to the outside, for heat dissipation) with a housing part arranged between the base and the outer bulb, wherein the housing part and the heat sink are further preferably held together by an interference fit (press fit), that is to say the heat sink is pressed into the housing part. If a heat sink is provided, the outer bulb can be made of a plastics material, which can have cost advantages. The outer bulb also does not have to provide, for example, a closed gas volume (containing thermally conductive gas), which can help to reduce the effort or outlay.

Thus, although the outer bulb does not have to hermetically seal the volume with the circuit board and the reflector therein by itself and together with the base and/or a housing part, it can at least be closed off to such an extent that the penetration of dust can be prevented. The thermal concept thus makes it unnecessary to provide, for example, ventilation slots and the like, which could otherwise allow the ingress of dirt. The outer bulb itself is preferably free of slots (connecting the inner and outer volumes).

In a preferred embodiment, the circuit board and the heat sink are in direct contact with one another and they have a contact surface with one another whose surface area is at least as large as a surface area of the two side surfaces of the circuit board that is equipped with LEDs. The base areas of the LEDs arranged on the circuit board are thus added together, and the contact surface between the heat sink and the circuit board should correspond at least to that total area. The contact surface is preferably divided into a plurality of surface parts (which are each formed, for example, by a tongue, see below) which are spaced apart from one another, the surface parts then further preferably being distributed equally over the side surfaces of the circuit board. The "base area" of an LED is taken at a perpendicular projection of the LED into a plane perpendicular to the thickness direction of the circuit board.

The contact surface which the circuit board and the heat sink have with one another should represent, for example, with increasing preference in this order at least 4 mm$^2$, 8 mm$^2$, 12 mm$^2$, 16 mm$^2$, or 20 mm$^2$. Possible upper limits (independently of the lower limits) are, for example, not more than 80 mm$^2$ or 60 mm$^2$.

In a preferred embodiment, the heat sink is in direct contact at the mutually opposite side surfaces of the circuit board, with in each case a tongue, preferably with in each case two tongues, further preferably in each case exactly two tongues, namely one tongue on each side of the reflector. The circuit board is held by a friction-based connection between the tongues, which each form a surface part of the contact surface; a certain force is thus required in order to move the circuit board along the outer bulb longitudinal axis, the circuit board can be prevented by a friction-based connection, for example, at least from slipping out under the action of gravity (in the case of an outer bulb longitudinal axis that is parallel to the direction of gravity).

For each tongue, the particular surface part of the contact surface can have a surface area of, for example, with increasing preference in this order, at least 2 mm$^2$, 3 mm$^2$, 4 mm$^2$, 5 mm$^2$, 6 mm$^2$, 7 mm$^2$, 8 mm$^2$, or 9 mm$^2$. Possible upper limits (independently of the lower limits) may be, for example, not more than 20 mm$^2$ or 15 mm$^2$.

For each tongue, it is preferred that a pressing region of the tongue forming the contact surface is closer to the LEDs than a deformation region of the tongue, the resilient deformation of which at least determines the majority of the pressing force. The tongue thus extends with the pressing region towards the LEDs and accordingly away from the base in the lighting means. The particular surface part (of the contact surface) can thus be arranged as close as possible to the LED, which helps to improve heat dissipation. In general, it can be preferred that at least the first and second LED (preferably also the third and fourth LED) have a smallest distance from their particular associated surface part of the contact surface of not more than, with increasing preference in this order, 15 mm, 10 mm, or 5 mm Possible lower limits may be, for example, at least 0.5 mm or 1 mm.

In the case of a tongue having a pressing region extending towards the LEDs, the pressing region can also be followed (going from the deformation region to the pressing region) by a reflection region which rises away from the circuit board and on which part of the light emitted by the particular LED is incident and is reflected with a directional component along the outer bulb longitudinal axis. The proportion of the light incident thereon and being reflected thereby can be, for example, at least 5% or 10% (and, for example, not more than 30% or 20%).

In a preferred embodiment, the heat sink is assembled from at least two parts, preference being given to exactly two parts, wherein the heat sink parts together enclose the circuit board, namely in relation to a circular path around the outer bulb longitudinal axis. With regard to the meaning of "assembled", reference is made to the above disclosure relating to the circuit board and the reflector. Preferably, the heat sink parts are assembled on the circuit board in such a manner that, with the assembly of the heat sink, the heat sink is also already in position on the circuit board (as well as thus also arranged in the lighting means on the circuit board). Preferably, the heat sink parts are locked together, thus they are then held together in an interlocking manner After assembly, the heat sink is preferably inserted, preferably pressed, into the housing part (see above), thus the heat sink is oversized relative to the housing part in order to be held therein with an interference fit.

Preferably, only when the circuit board, the heat sink and the housing part have been assembled is the reflector assembled with the circuit board, preferably fitted together therewith in the manner described above. Preferably, on assembly of the circuit board and the reflector, the base is already mounted on the housing part, thus the circuit board is electrically operably (via a driver electronics) or electrically conductively (where a driver electronics is arranged on the circuit board) connected to the base.

After the circuit board and the reflector have been assembled, the outer bulb is fitted to the housing part, preferably seated in the form of a monolithic part having a movement along the outer bulb longitudinal axis. Preferably, the outer bulb is thereby pushed into the housing part to a certain extent and locks therewith.

Apart from the assembly of the heat sink parts around the circuit board, such a production method can, however, also be preferred in the case of a one-piece/monolithic heat sink. Such a heat sink can then also be held in the housing part by an interference fit, for example. In particular in the case of the monolithic heat sink (but generally also in the case of an assembled heat sink), the circuit board and the heat sink can generally also be connected together by a material-based connection, for example by a soldered or preferably welded connection.

In a preferred form of the heat sink assembled from heat sink parts, the heat sink and the circuit board are connected together in an interlocking manner, whereby the interlocking connection is intended to block a relative movement of the circuit board and the heat sink parallel to the outer bulb longitudinal axis. For that purpose there is preferably provided in the circuit board a groove which extends between the mutually opposite side surfaces thereof, preferably at an edge surface of the circuit board extending parallel to the outer bulb longitudinal axis, the edge surface is set back in the groove relative to the remainder of the edge surface. The assembled heat sink then engages into the groove and in this respect holds the circuit board in position.

In a preferred embodiment, the outer bulb and the housing part arranged between the base and the outer bulb adjoin one another at a circumferential (around the outer bulb longitudinal axis) line and the heat sink shades this boundary line from the LEDs, which prevents a direct light input, thus light falls from the LEDs onto the line without reflection. This can be perceived as more aesthetically pleasing when the lighting means is viewed from outside. Of course, the outer bulb and the housing part can also adjoin one another circumferentially at a surface; the "boundary line", when looking at the lighting means from outside, is considered to be the transition, visible at the outer surface of the lighting means, between the housing part and the outer bulb.

A housing part arranged between the base and the outer bulb and assembled (see the above disclosure relating to this term) with both is generally preferred, it being possible for the housing part, based on a total length of the lighting means taken along the outer bulb longitudinal axis (from the base end to the opposite outer bulb end), to extend over, for example, at least 10%, preferably at least 20%, of that total length; possible upper limits are, for example, not more than 40% or 30%.

The lighting means can, however, generally also be designed without such a housing part, the outer bulb and the base then being assembled directly, that is to say adjoining one another (as in a conventional filament bulb). The driver electronics can then be accommodated in the base, for example. In order to be able to recreate a filament bulb shape with an outer bulb tapering towards the base, the outer bulb is in this case preferably assembled from two half-shells, which further preferably adjoin one another in a plane containing the outer bulb longitudinal axis.

Independently of this configuration (with/without a housing part) and the outer bulb specifically, the driver electronics for supplying the LEDs is in a preferred embodiment arranged with the LEDs on the same circuit board. Preferably, the lighting means has only a single circuit board, which already has cost advantages and can also help to reduce the outlay in terms of mounting. Because the lighting means is provided with a heat sink, it is not necessary, for example, for cooling purposes to evacuate the outer bulb and fill it with thermally conductive gas, but the outer bulb can instead be filled with air. Housed electronic components (driver electronics) can then be arranged in the same air volume, which would be disadvantageous in the case of a thermally conductive gas, for example due to outgassing of the molding compound.

As already mentioned at the beginning, the invention relates also to a method for producing a lighting means disclosed herein, wherein the circuit board and the reflector are provided as separate, individually handled parts and then assembled. When the reflector and the circuit board are assembled, the circuit board is preferably already equipped with the LEDs and optionally also with a driver electronics. With regard to further advantageous variants, reference is made explicitly to the above disclosure.

The invention relates also to the use of a lighting means disclosed herein for a luminaire, wherein the base of the lighting means is fitted, preferably screwed, into a socket of the luminaire.

BRIEF DESCRIPTION OF THE DRAWINGS

The invention will be explained in greater detail below by means of exemplary embodiments, wherein the individual features within the scope of the further independent claims can also be essential to the invention in a different combination and, as before, a specific distinction is not made between the different claim categories.

The drawings specifically show

FIG. 8a-e different method steps in the assembly of the lighting means according to FIG. 7;

PREFERRED EMBODIMENT OF THE INVENTION

Figure 1:
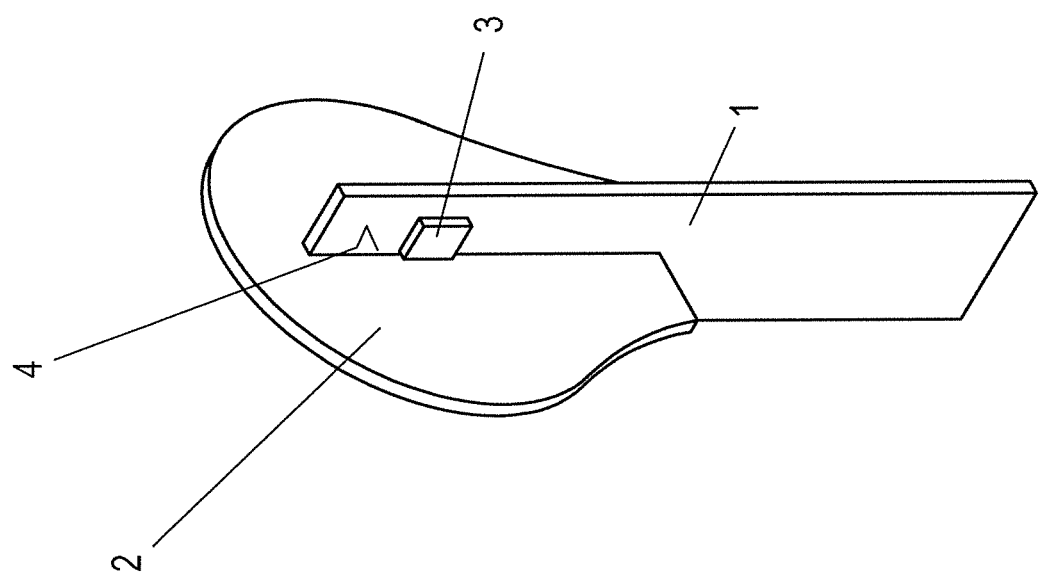
FIG. 1 circuit board and reflector of a lighting means according to the invention.

FIG. 1 shows a circuit board 1 with a reflector 2 in an oblique view. On the circuit board 1 there are arranged four LEDs 3, only one of which is visible for reasons of perspective. The LEDs 3, as SMD components, are electrically conductively connected to a conductive track structure of the circuit board 1, the conductive track structure being covered with a reflective layer forming a reflecting surface 4 (the reflective layer is open in the region of the LEDs 3, which is not shown in detail).

Figure 2:
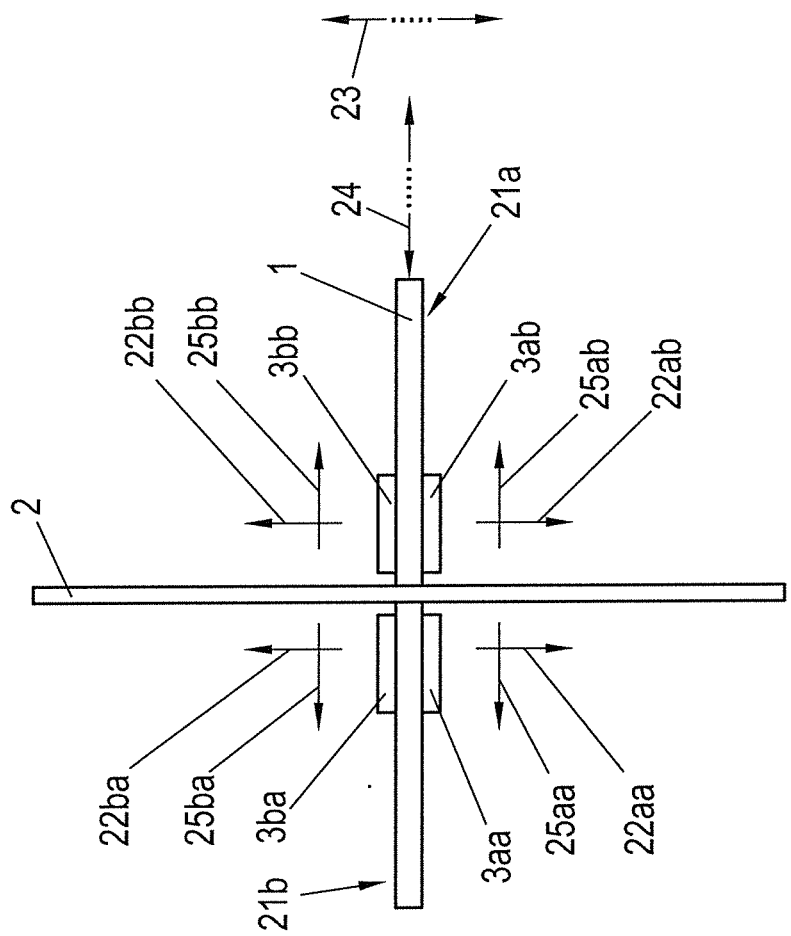
FIG. 2 the circuit board and the reflector according to FIG. 1, along a longitudinal axis of the outer bulb of a lighting means according to the invention, as seen from above.

The view according to FIG. 2 illustrates the arrangement of the circuit board 1 and the reflector 2 in a cross shape and in particular also the relative arrangement of the LEDs 3. A first 3aa and third LED 3ab are arranged on the same side 21a of the circuit board 1; a second 3ba and fourth LED 3bb are arranged on the opposite side 21b. Each of the LEDs 3 emits light with a particular LED main propagation direction 22. The LED main propagation directions 22aa, 22ab of the first 3aa and third LED 3ab are parallel to one another and opposed to the LED main propagation directions 22ba, 22bb of the second 3ba and fourth LED 3bb. This arrangement of the LEDs 3 on the mutually opposite sides 21 of the flat circuit board 1 is advantageous in terms of mounting, because it can be less expensive to equip both sides than to equip a three-dimensional arrangement.

However, with the mutually opposite LED main propagation directions 22, light would be emitted predominantly upwards and downwards in the representation according to FIG. 2, but the left and right side would be underprovided. In a reference system of the circuit board 1, a thickness direction 23 would preferentially be provided, while the surface directions 24 remained underprovided or even not provided at all. In order to redistribute light in the surface directions 24, the reflector 2 is therefore provided, which reflector is in the form of a monolithic plastics part, for example made of polybutylene terephthalate (PBT); on account of reflective particles embedded in the plastics material, the reflector has a degree of reflection of about 90% to 98%.

Some of the light from each of the LEDs 3 is then incident on the reflector 2 and is reflected thereby, namely in each case an amount of about 40%. The reflector 2 reflects the light diffusely, for which reason a particular main propagation direction 25 of the particular reflected light is then approximately at a right angle to the particular LED main propagation direction 22. The reflected light is thus distributed predominantly in the surface directions 24, which originally are scarcely provided or not provided at all.

FIG. 3 shows the light distribution in the far field, namely the radiant intensity I in dependence on the elevation angle, that is to say the angle θ in polar coordinates, the z-axis coinciding with the outer bulb longitudinal axis (see below) and the base of the lighting means being at +/−180°.

Figure 3A:
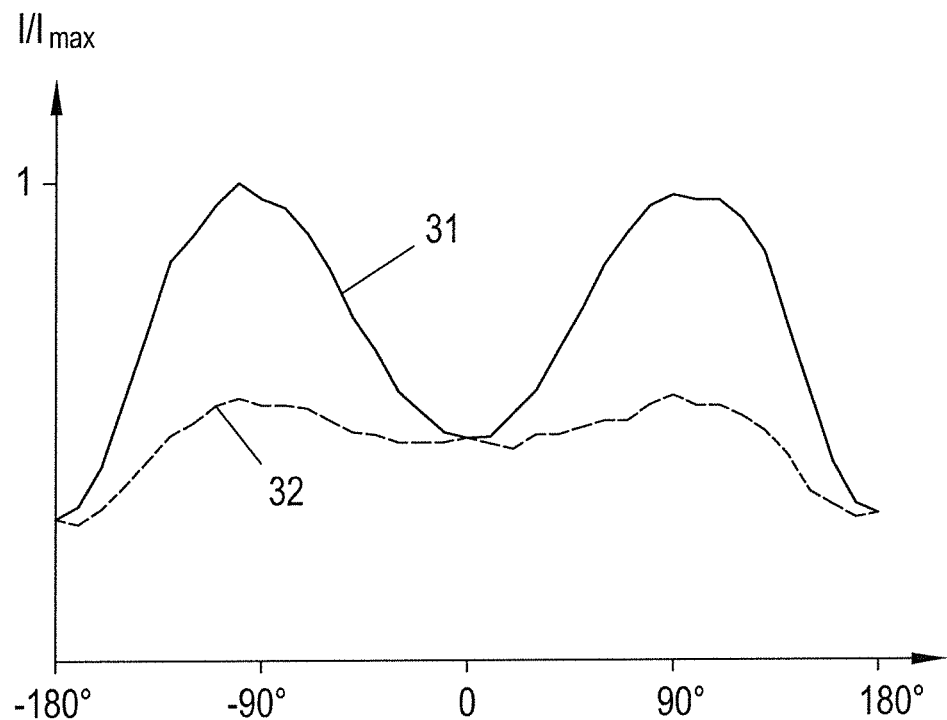
FIG. 3a, b light distribution curves to illustrate the redistribution of the light by the reflector.

FIG. 3a shows two light distribution curves of an arrangement, not shown in the present figures, of a reflector 2 and circuit board 1 with LEDs at a distance from the reflector 2 of in each case 9.5 mm, that is to say a relatively great distance. The curve 31 is taken at an azimuth angle (Φ angle in polar coordinates) at which, at an elevation angle of +/−90°, the particular LEDs 3 are viewed along the particular LED main propagation direction 22. The second curve 32, on the other hand, is taken at an azimuth angle at which the viewing direction is always perpendicular to the LED main propagation directions 22, that is to say comparable to the view in FIG. 2.

If the distance between the LEDs 3 and the reflector 2 is in each case large, the two curves 31, 32 are far apart, in particular at elevation angles around 90°. If a corresponding lighting means were thus to be viewed from the side, the particular radiant intensity reaching the observer would be greatly dependent on whether view is of the circuit board 1 (curve 31, high radiation intensity) or of the reflector 2 (curve 32, low radiation intensity).

Figure 3B:
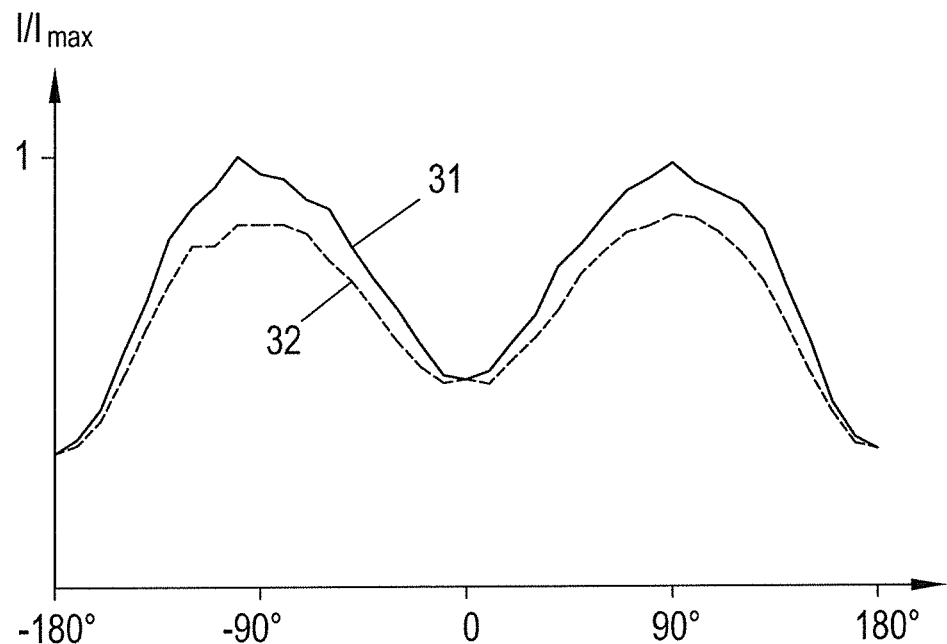

Like FIG. 3a, FIG. 3b is also based on a simulation, namely, with otherwise unchanged boundary conditions, with a reduced distance between the LEDs and the reflector of 2.5 mm and a circuit board of smaller width (of only 20 mm in contrast with about 56 mm in the simulation on which FIG. 3a is based). As a result, the dependency on the azimuth angle is significantly reduced, in other words the variation in the light intensity in a circular path around the outer bulb longitudinal axis (see below) is considerably smaller.

Figure 4:
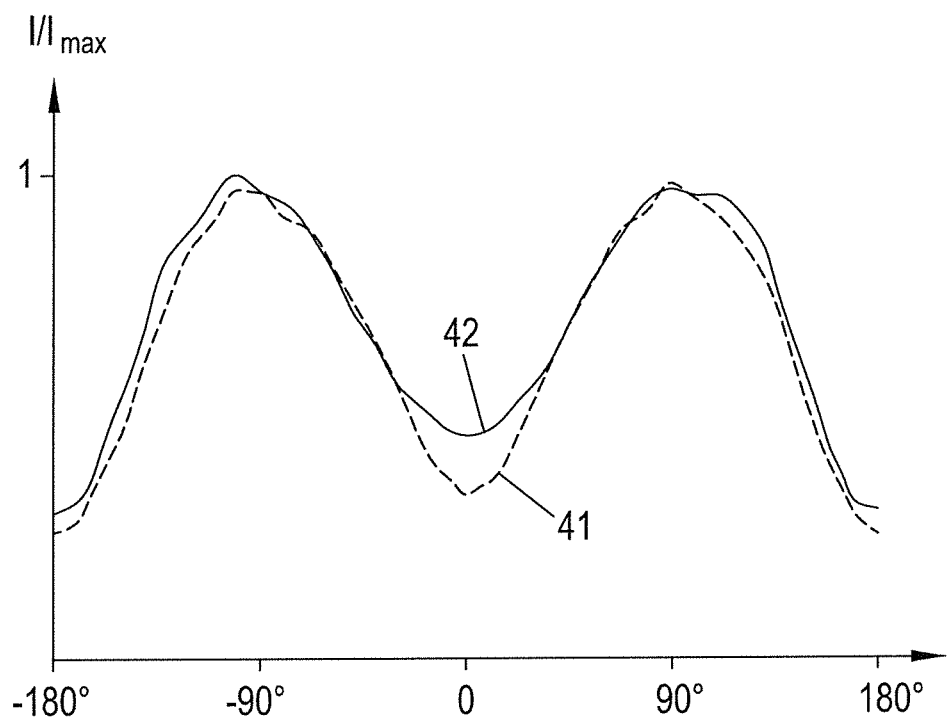
FIG. 4 light distribution curves to illustrate the effect of the light distribution of each individual LED.

FIG. 4 also shows two light distribution curves, wherein both curves are in this case taken at the same azimuth angle (front view of the LEDs 3 at an elevation angle of +/−90°, corresponding to curves 31 from FIG. 3) and the underlying circuit board/reflector geometry is also no different. However, in the simulation underlying the first curve 41, LEDs 3 each having Lambertian light distribution (full width at half maximum of 120°) were used, whereas the LEDs 3 assumed in the simulation underlying the second curve 42 each had a light distribution with a full width at half height >120°. In the case of the second curve 42, each of the LEDs 3 filled a larger solid angle in comparison to a half-space. A direct comparison of curves 41, 42 shows that, in this manner, the local minimum at 0° can at least be reduced. A variation in radiant intensity, which occurs on passing through the elevation angle, is thus at least reduced.

Figure 5:
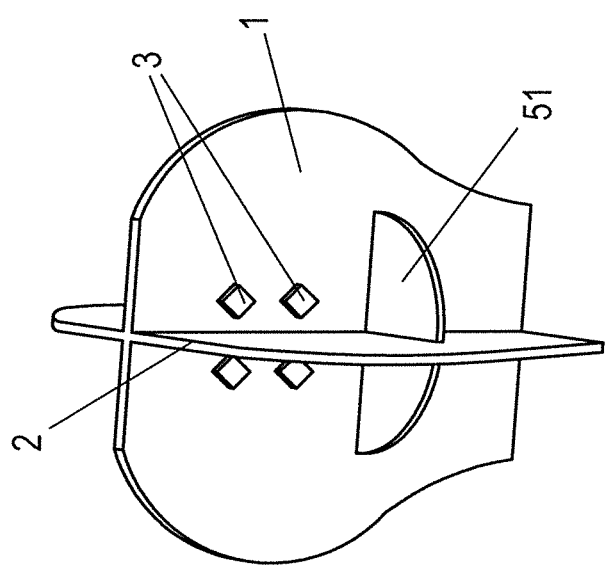
FIG. 5 an arrangement with a circuit board, a reflector and an additional transverse reflector.

The embodiment of FIG. 5 is also concerned with light redistribution in that direction, that is to say along the outer bulb longitudinal axis. FIG. 5 shows a circuit board 1 with LEDs 3 and a reflector 2; reference is made explicitly to the above description. Unlike in the arrangement discussed hitherto, in the present case each quadrant, which is created by the cross-wise arrangement of the circuit board 1 and the reflector 2, is not provided with only one LED 3 but with two LEDs 3. Furthermore, in addition to the reflector 2 a further reflector is provided, namely a transverse reflector 51, which extends perpendicularly to the outer bulb longitudinal axis. The transverse reflector 51 is to reflect some of the light with a directional component along the outer bulb longitudinal axis, that is to say upwards in FIG. 5.

Figure 6:
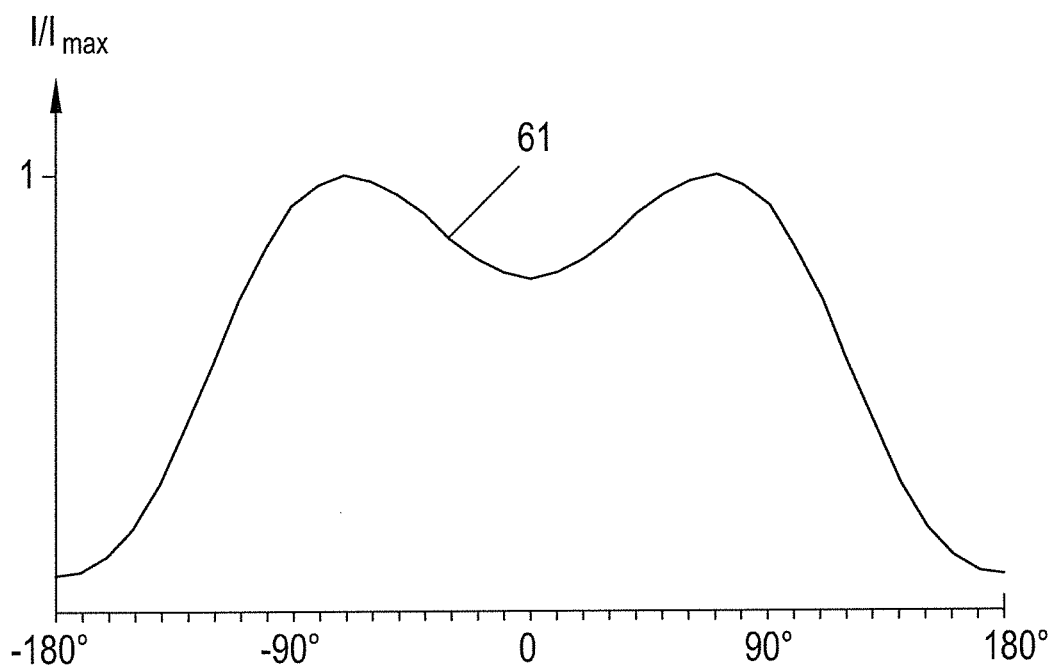
FIG. 6 light distribution curves for the arrangement according to FIG. 5 to illustrate the effect of the transverse reflector.

FIG. 6 shows a light distribution curve 61 taken on this arrangement, for the same azimuth angle as in FIG. 4 (front view of LEDs at an elevation angle of +/−90°). Although there is still a local minimum at 0° in the case of the transverse reflector 51 too, this is significantly reduced, as is shown by a comparison with curves 41, 42 according to FIG. 4.

Figure 7:
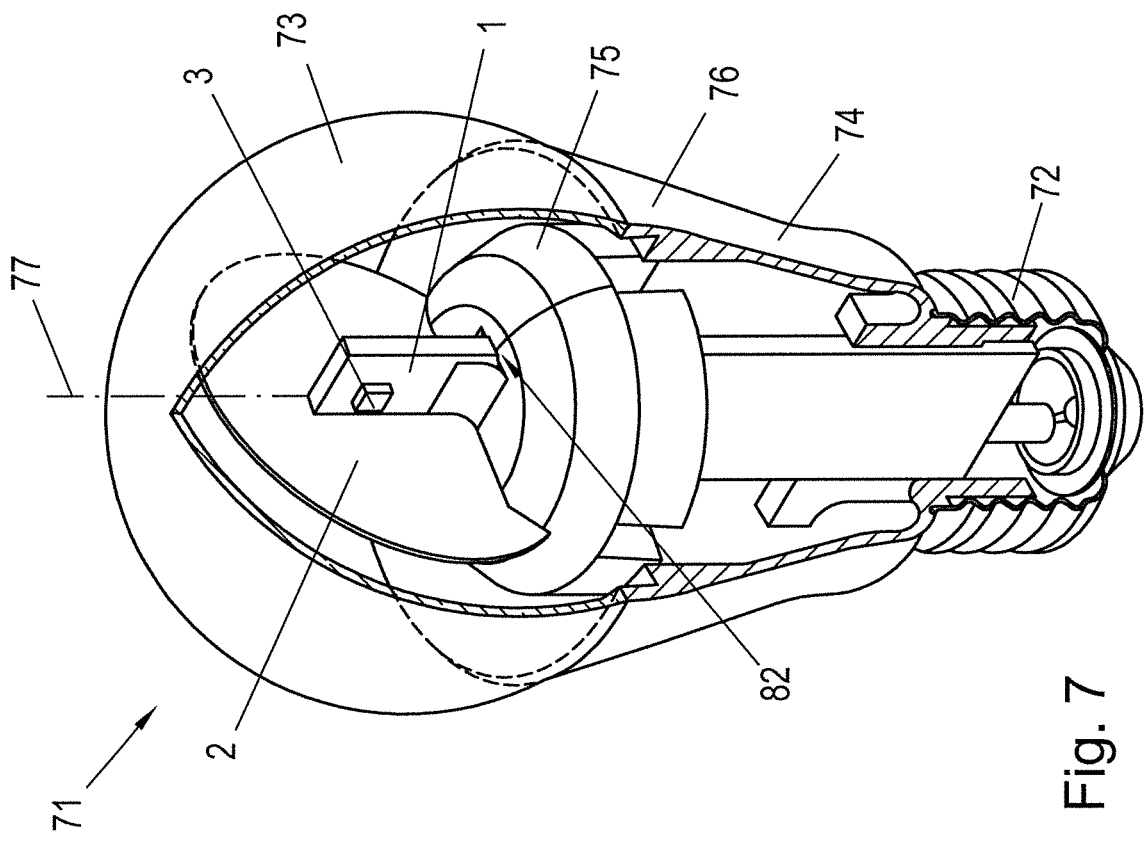
FIG. 7 a lighting means according to the invention having a combination of a circuit board and a reflector according to FIG. 1 in a partially cutaway oblique view.

FIG. 7 shows a lighting means 71 having the circuit board 1 and the reflector 2 according to FIGS. 1 and 2 (reference is also made to the above description). The lighting means 71 is a replacement for a conventional filament bulb, for which reason the lighting means is equipped with an E27 base 72. The circuit board 1 is electrically conductively connected to the base 72 so that, when a voltage is applied to the base connecting points, a corresponding voltage is present at the circuit board 1. On the circuit board 1 there is provided a driver electronics (not shown), which adapts the voltage for operation of the LEDs 3.

The lighting means 71 further has an outer bulb 73 of plastics material. The outer bulb is shown clear here, but in reality it is frosted. Between the outer bulb 73 and the base 72 there is arranged a housing part 74. An outer bulb longitudinal axis 77 extends through the lighting means 71 and passes through the base 72 and the outer bulb 73.

The lighting means 71 further has a heat sink 75 of aluminum, which serves to dissipate the heat generated by the LEDs 3. To that end, the heat sink 75 rests with four tongues (see FIGS. 8 and 9) flat against the circuit board 1. The heat sink 75 is in contact with the housing part 74, which forms an outer surface 76 of the lighting means 71. The heat sink 75 has a thermal resistance Rth of about 5 K/W.

FIG. 8 illustrates the assembly of the lighting means 71 in several steps. Initially, the outer bulb 73, the reflector 2 and the circuit board 1 are separate parts. Furthermore, the heat sink 75 is also produced from two heat sink parts 75*a, b* which are initially separate (FIG. 8*a*). In a first step, the two heat sink parts 75*a, b* are fitted to the circuit board 1, thus the heat sink 75 is assembled in its position on the circuit board 1 (FIG. 8*b*).

With the assembly of the heat sink 75, tongues 81 provided on the heat sink are applied to the circuit board 1. Furthermore, the circuit board 1 is provided with a groove 82 (see FIG. 7 in detail), into which the heat sink 75 engages. The circuit board 1 and the heat sink 75 are thus fixed in their relative position in relation to the outer bulb longitudinal axis 77.

The housing part 74 and the base 72 are initially also separate parts, which are assembled (FIG. 8*b*). In a next step, the unit consisting of the circuit board 1 with the heat sink 75 is pressed into the housing part 74 (along the outer bulb longitudinal axis 77) and is then held therein by an interference fit (FIG. 8*c*). The reflector 2 and the circuit board 1 are then assembled, for which purpose a slot 82 is provided in the reflector 2 and a slot 83 is also provided in the circuit board 1. The circuit board 1 and the reflector 2 are fitted together in the slot direction 84 (FIG. 8*d*), a slot 86 to accommodate the reflector 2 also being provided in the heat sink 75.

In a final step (FIG. 8*e*), the outer bulb 73 is fitted, namely inserted to a certain extent into the housing part 74, with a movement along the outer bulb longitudinal axis 77. The outer bulb 73 is then held in an interlocking manner in the housing part 74.

Figure 9:
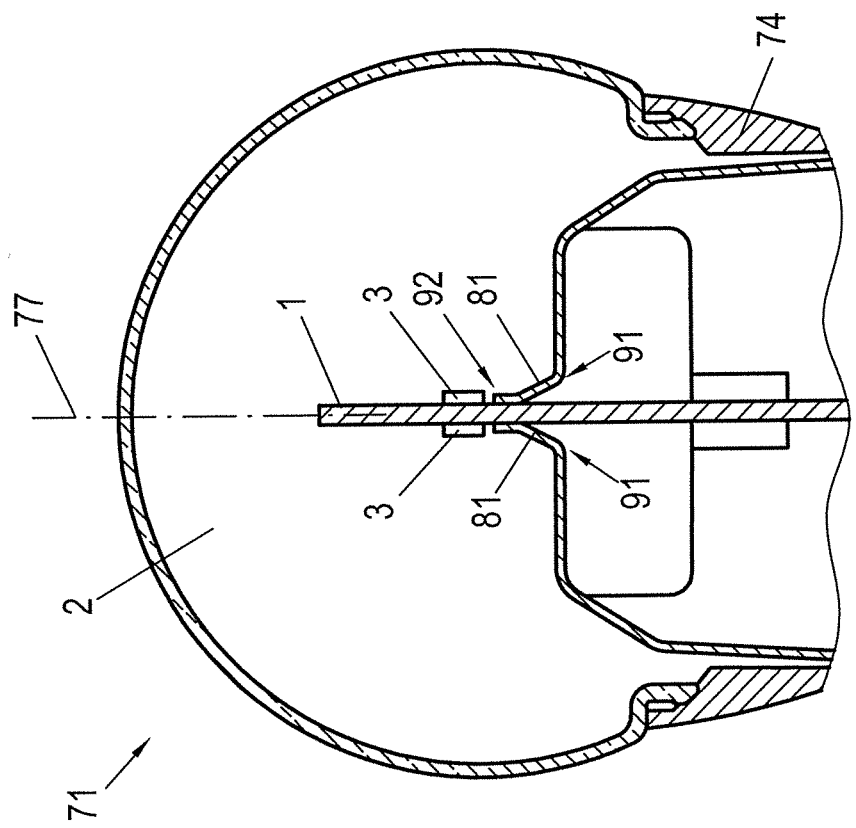
FIG. 9 the lighting means according to FIG. 7 in a partially cutaway side view.

FIG. 9 shows a portion of the lighting means 71 in a cutaway side view, namely looking along the surface directions of the circuit board 1, looking at the lighting means 71 from the side, that is to say with a top view of the reflector 2. The tongues 81 can be seen in particular, which each rest flat against the circuit board 1. Each of the tongues 81 is divided into a deformation region 91, the resilient deformation of which presses the tongue 81, and a pressing region 92 with which the tongue 81 is in contact with the circuit board 1.

In an alternative embodiment (not shown), the tongue 81 lifts away from the circuit board 1 again following the pressing region 92. The portion of the tongue 81 that lifts away from the circuit board 1 forms a small reflector with which some of the light can be reflected with a directional component along the outer bulb longitudinal axis 77.

Figure 10:
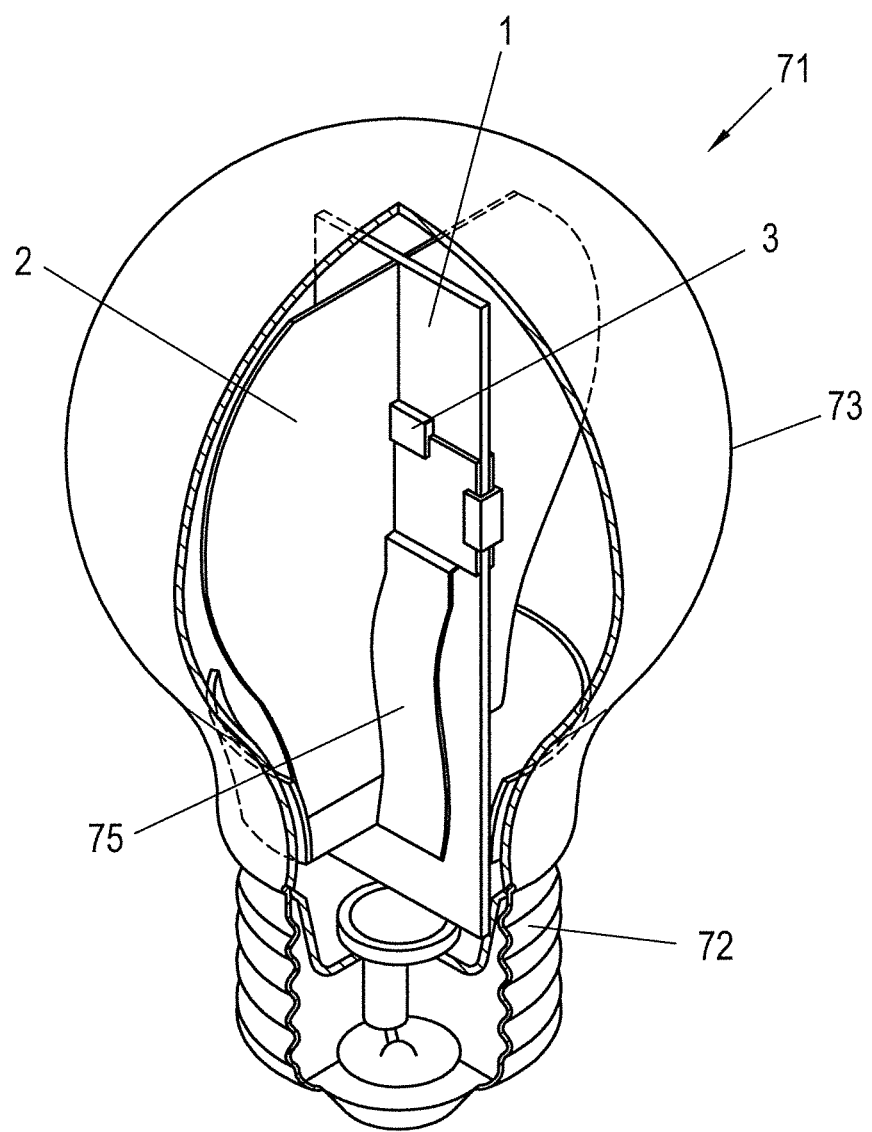
FIG. 10 an alternative lighting means to FIG. 7, which likewise contains a combination of a circuit board and a reflector.

FIG. 10 shows an alternative lighting means 71 which, in contrast to the lighting means 71 according to FIG. 7, does not have a housing part 74. The outer bulb 73 and the base 72 thus adjoin one another directly in this case. The outer bulb 73 is assembled from two half-shells around the circuit board 1 and the reflector 2, and then the base 72 is fitted. In this case too, a heat sink 75 is provided (for the thermal properties thereof, reference is made to the above description). The circuit board 1 and the heat sink 75 are soldered or welded with one another.

Figure 11:
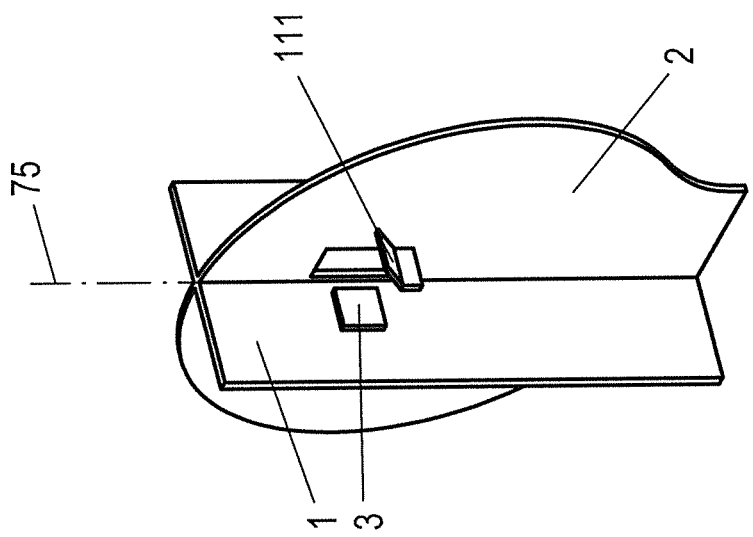
FIG. 11 a reflector in which a part region has been folded out.

FIG. 11 shows a combination of a circuit board 1 and a reflector 2 for a lighting means according to the invention, wherein a part region 111 has been folded out of the reflector 2. This part region 111 is stamped with an unclosed line, that is to say is not separated completely from the remainder of the reflector 2. Along a remaining connecting web with the remainder of the reflector 2, the part region 111 is folded out relative thereto; a further fold line extends in the part region 111 itself.

As a result, the part region 111 provides an upwardly facing reflective surface. At least some of the light from the LED 3 that is incident on the reflector 2 is reflected upwards by the part region 111, that is to say with a directional component along the outer bulb longitudinal axis 77. The local minimum at an elevation angle of 0° (see FIGS. 4 and 6) can thus be reduced, that is to say the difference in radiation intensity relative to the adjacent maxima can be reduced.

Figure 12:
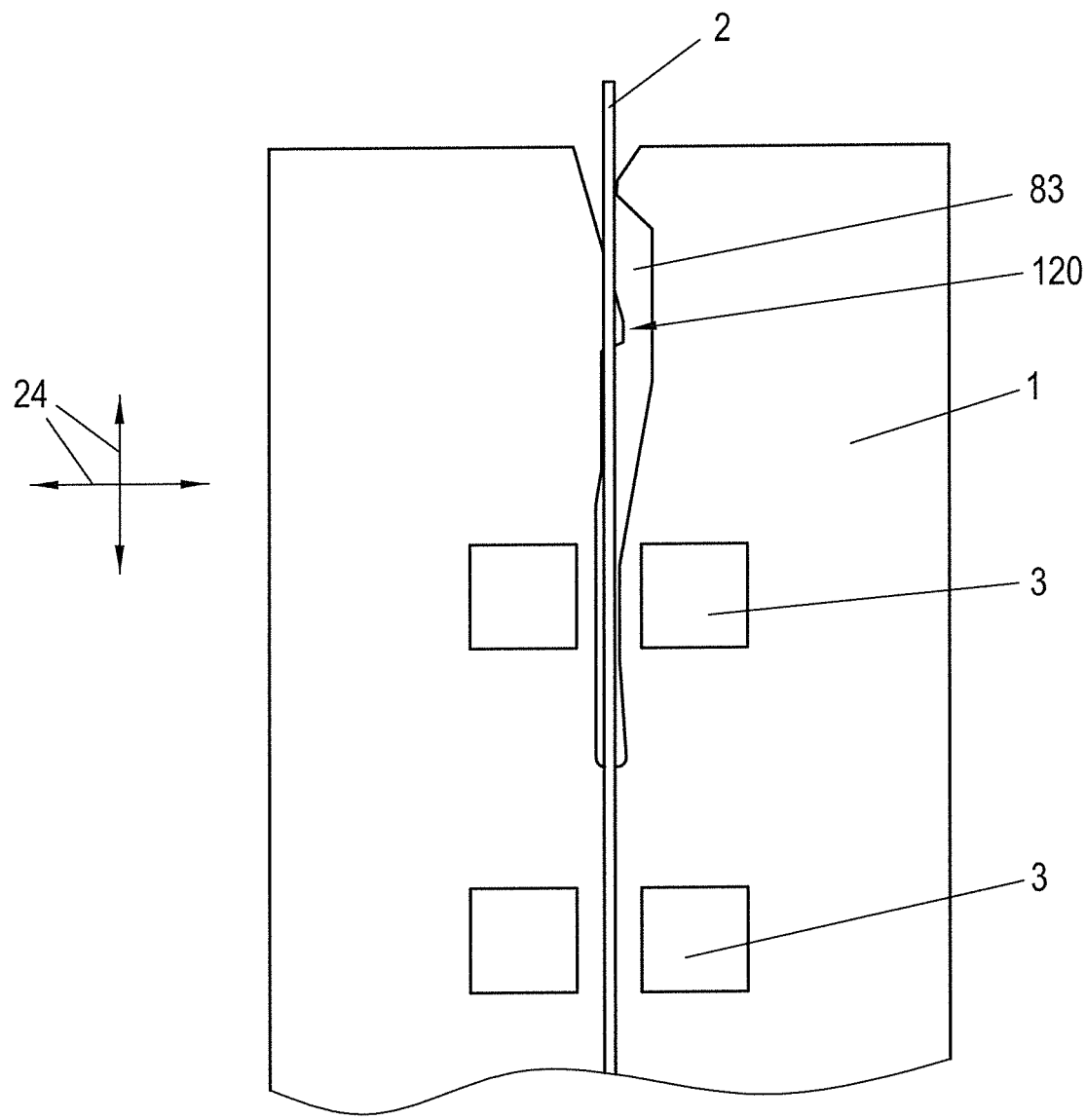
FIG. 12 a top view of the circuit board of a lighting means according to the invention to illustrate the slot with the reflector held therein.

FIG. 12 shows the circuit board 1 of a lighting means 71 according to the invention in a top view, namely looking along the LED main propagation directions. Accordingly, the reflector 2 can be seen from the side, looking at its narrow edge. FIG. 12 illustrates in detail the configuration of the slot 83 in the circuit board 1. In order to facilitate insertion of the reflector 2 upon assembly, the slot 83 widens towards the outer edge of the circuit board 1.

When the reflector 2 has been pushed fully into the slot 83, a projection 120, which is formed by one of the slot flanks delimiting the slot 83 with respect to the surface directions 24, engages in the reflector 2. For that purpose there is provided in the reflector 2 a through-hole (not visible in the side view) into which the projection 120 engages. Based on the surface directions 24, the reflector 2 in its end position then has three contact regions with the circuit board 1, that is to say with the slot flanks thereof delimiting the slot 83. The three contact points provide a straight extent for the reflector 2 in its end position.

The invention claimed is:

1. A lighting means having:
   a first and a second LED for emitting light;
   a flat circuit board having a conductive track structure, on which circuit board the LEDs are mounted and thereby electrically conductively connected to the conductive track structure;
   a reflector which is assembled with the circuit board and is itself free of LEDs, wherein the reflector is inserted into a slot in the circuit board;
   an outer bulb which is transmissive for the light emitted by the LEDs and in which the circuit board with the LEDs and the reflector are arranged; and
   a base to which the LEDs are electrically operably connected via the conductive track structure;
   wherein the first and the second LED are mounted on mutually opposite faces of the circuit board and, for each LED, at least 20% of the emitted light is incident on the reflector and is reflected thereby in order to homogenize the light distribution generated by the lighting means, for which the particular reflected light has a main propagation direction with a directional component that is parallel to a surface direction of the flat circuit board.

2. The lighting means according to claim 1, wherein the reflector is in one piece.

3. The lighting means according to claim 2, wherein the reflector and the circuit board are fitted each as flat parts into one another at a right angle to one another.

4. The lighting means according to claim 1, wherein a projection is formed on one of the slot flank delimiting the slot in relation to the surface directions, said projection engaging into a hole in the reflector and holding the reflector in position.

5. The lighting means according to claim 1, wherein, in the case of the particular reflected light, the directional component lying parallel to the particular surface direction is in each case greater than a directional component perpendicular thereto.

6. The lighting means according to claim 1, wherein the light reflected by the reflector is reflected diffusely by the reflector.

7. The lighting means according to claim 1, wherein, for each LED, the circuit board and a side surface of the reflector, on which the light emitted by the LED is incident, adjoin one another at an edge, wherein the LED has a smallest distance taken from the edge along one of the surface directions of the circuit board of not more than 8 mm.

8. The lighting means according to claim 1, wherein, for each LED, the circuit board and a side surface of the reflector, on which the light emitted by the relevant LED is incident, adjoin one another at an edge, from which edge, taken perpendicularly up to a margin, the side surface of the reflector has a mean extent d, wherein the LED has a smallest distance to the edge taken along one of the surface directions of not more than 0.3·d.

9. The lighting means according to claim 1, wherein the outer bulb has a longitudinal axis and the LEDs are arranged relative thereto such that a particular LED main propagation direction, with which the particular LED emits the light, encloses an angle of at least 80° and not more than 100° with a longitudinal direction parallel to the outer bulb longitudinal axis and pointing away from the base in the direction towards the outer bulb.

10. The lighting means according to claim 9, wherein the light distribution generated with the lighting means is homogenized in that light intensity values taken on a circular path around the outer bulb longitudinal axis at an angle of 90° to the outer bulb longitudinal direction represent at least 30% of a maximum value of the light intensity taken on the circular path.

11. The lighting means according to claim 1, additionally having a third and a fourth LED, wherein the first and the third LED are arranged together and the second and the fourth LED are arranged together on the same face of the circuit board, wherein the light from the LEDs arranged on the same face is incident on mutually opposite sides of the reflector.

12. The lighting means according to claim 9, wherein at least one of:
a part region of the reflector, which has a surface area of not more than 20% of the reflector as a whole, is partially separated from the remainder of the reflector and folded out in such a manner that light reflected at the reflector part region has a main propagation direction with a dominant directional component parallel to the outer bulb longitudinal axis; and there is provided an additional transverse reflector assembled with the circuit board and the reflector, which transverse reflector extends transversely to the outer bulb longitudinal axis.

13. The lighting means according to claim 1, wherein the LEDs each emit the light with a light distribution whose full maximum at half width is >120°.

14. The lighting means according to claim 1, wherein the circuit board is formed of a substrate whose mutually opposite faces are each provided with structured copper as the conductive track structure, wherein the copper conductive tracks have a thickness, taken perpendicularly to the surface directions of the circuit board, of at least 35 μm.

15. The lighting means according to claim 1, having a heat sink which is provided in direct thermal contact with the circuit board and forms an outer surface of the lighting means or is provided in direct thermal contact with a part forming an outer surface of the lighting means, wherein the heat sink has a thermal resistance $R_{th}$ of not more than 25 K/W.

16. The lighting means according to claim 15, wherein the circuit board and the heat sink are in direct contact with one another and have a contact surface with one another whose surface area is at least as large as a surface area of the circuit board equipped with LEDs.

17. The lighting means according to claim 16, wherein the heat sink rests directly on the mutually opposite faces of the circuit board with at least two tongues, and the circuit board is held between the tongues by a friction-based connection.

18. The lighting means according to claim 15, wherein the heat sink is assembled from at least two parts, which heat sink parts together enclose the circuit board.

19. The lighting means according to claim 18, wherein the heat sink and the circuit board are connected together in an interlocking manner, wherein the heat sink engages into a groove on a side edge of the circuit board, which groove extends from one of the two mutually opposite faces of the circuit board to the other.

20. A method for producing a lighting means according to claim 18, the method comprising:
providing the circuit board and the reflector each as separate parts; and
assembling the reflector and the circuit board, wherein first the heat sink is assembled with the circuit board from the heat sink parts and then the reflector and the circuit board are assembled.

21. The lighting means according to claim 15, having a housing part which forms an outer surface of the lighting means arranged between the outer bulb and the base and adjoining the outer bulb at a circumferential line, wherein the heat sink shades the circumferential boundary line in relation to the light emitted directly by the LEDs.

22. A method for producing a lighting means according to claim 1, the method comprising:
providing the circuit board and the reflector each as separate parts; and
assembling the reflector and the circuit board.

23. A lighting means having:
a first and a second LED for emitting light;
a flat circuit board having a conductive track structure, on which circuit board the LEDs are mounted and thereby electrically conductively connected to the conductive track structure;
a reflector which is assembled with the circuit board and is itself free of LEDs;

an outer bulb which is transmissive for the light emitted by the LEDs and in which the circuit board with the LEDs and the reflector are arranged; and a base to which the LEDs are electrically operably connected via the conductive track structure;

wherein the first and the second LED are mounted on mutually opposite faces of the circuit board and, for each LED, at least 20% of the emitted light is incident on the reflector and is reflected thereby in order to homogenize the light distribution generated by the lighting means, for which the particular reflected light has a main propagation direction with a directional component that is parallel to a surface direction of the flat circuit board;

wherein the outer bulb has a longitudinal axis and the LEDs are arranged relative thereto such that a particular LED main propagation direction, with which the particular LED emits the light, encloses an angle of at least 80° and not more than 100° with a longitudinal direction parallel to the outer bulb longitudinal axis and pointing away from the base in the direction towards the outer bulb; and wherein a part region of the reflector, which has a surface area of not more than 20% of the reflector as a whole, is partially separated from the remainder of the reflector and folded out in such a manner that light reflected at the reflector part region has a main propagation direction with a dominant directional component parallel to the outer bulb longitudinal axis.

24. A lighting means having:

a first and a second LED for emitting light;

a flat circuit board having a conductive track structure, on which circuit board the LEDs are mounted and thereby electrically conductively connected to the conductive track structure;

a reflector which is assembled with the circuit board and is itself free of LEDs;

an outer bulb which is transmissive for the light emitted by the LEDs and in which the circuit board with the LEDs and the reflector are arranged; and a base to which the LEDs are electrically operably connected via the conductive track structure;

wherein the first and the second LED are mounted on mutually opposite faces of the circuit board and, for each LED, at least 20% of the emitted light is incident on the reflector and is reflected thereby in order to homogenize the light distribution generated by the lighting means, for which the particular reflected light has a main propagation direction with a directional component that is parallel to a surface direction of the flat circuit board;

wherein the outer bulb has a longitudinal axis and the LEDs are arranged relative thereto such that a particular LED main propagation direction, with which the particular LED emits the light, encloses an angle of at least 80° and not more than 100° with a longitudinal direction parallel to the outer bulb longitudinal axis and pointing away from the base in the direction towards the outer bulb; and wherein there is provided an additional transverse reflector assembled with the circuit board and the reflector, which transverse reflector extends transversely to the outer bulb longitudinal axis.

* * * * *

UNITED STATES PATENT AND TRADEMARK OFFICE
CERTIFICATE OF CORRECTION

PATENT NO. : 10,697,592 B2  
APPLICATION NO. : 15/566556  
DATED : June 30, 2020  
INVENTOR(S) : Bergenek et al.

Page 1 of 1

It is certified that error appears in the above-identified patent and that said Letters Patent is hereby corrected as shown below:

In the Claims

Column 19, Claim 4, Line 2, after "one", remove --of the--.

Signed and Sealed this  
Second Day of February, 2021

Drew Hirshfeld  
*Performing the Functions and Duties of the*  
*Under Secretary of Commerce for Intellectual Property and*  
*Director of the United States Patent and Trademark Office*